(12) United States Patent
Towle

(10) Patent No.: US 6,436,822 B1
(45) Date of Patent: Aug. 20, 2002

(54) METHOD FOR MAKING A CARBON DOPED OXIDE DIELECTRIC MATERIAL

(75) Inventor: Steven N. Towle, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/717,519

(22) Filed: Nov. 20, 2000

(51) Int. Cl.$^7$ ................................................ H01L 21/44
(52) U.S. Cl. ........................................ 438/681; 438/931
(58) Field of Search ................................ 438/483, 484, 438/485, 603, 604, 680, 681, 710, 715, 789, 790, 905, 913, 780, 781, 931

(56) References Cited

U.S. PATENT DOCUMENTS

| | | | | |
|---|---|---|---|---|
| 3,614,552 A | * | 10/1971 | Teuschler | 317/235 |
| 4,726,963 A | * | 2/1988 | Ishihara et al. | 427/93 |
| 4,818,563 A | * | 4/1989 | Ishihara et al. | 427/55 |
| 6,025,273 A | * | 2/2000 | Chen et al. | 438/706 |
| 6,251,770 B1 | * | 6/2001 | Uglow et al. | 438/624 |
| 6,258,407 B1 | * | 7/2001 | Lee et al. | 427/255.28 |

* cited by examiner

Primary Examiner—Viet Q. Nguyen
Assistant Examiner—David Nhu
(74) Attorney, Agent, or Firm—Mark V. Seeley

(57) ABSTRACT

A method of forming a carbon doped oxide dielectric material on a substrate is described. That method comprises introducing into a chemical vapor deposition apparatus an alkyl oxysilane precursor. That apparatus is then operated under conditions that cause a carbon doped oxide to form on the substrate, while maintaining the substrate temperature at less than about 200° C.

17 Claims, 1 Drawing Sheet

METHOD FOR MAKING A CARBON DOPED OXIDE DIELECTRIC MATERIAL

FIELD OF THE INVENTION

The present invention relates to a method for making a dielectric material, in particular, a method for making a carbon doped oxide using an alkyl oxysilane precursor.

BACKGROUND OF THE INVENTION

Semiconductor devices include metal layers that are insulated from each other by dielectric layers. As device features shrink, reducing the distance between the metal layers and between metal lines within each layer, capacitance increases. To address this problem, insulating materials that have a relatively low dielectric constant are being used in place of silicon dioxide (and other materials that have a relatively high dielectric constant) to form the dielectric layer that separates the metal lines.

A material that may be used to form such a low k dielectric layer is carbon doped oxide ("CDO"). Using this material instead of silicon dioxide to separate metal lines may yield a device having reduced propagation delay, crosstalk noise and power dissipation. In a conventional process for forming a CDO dielectric layer on a substrate (e.g., a silicon wafer), vapor phase species that provide a source or sources of silicon and carbon ("precursors") and oxygen are introduced into a plasma enhanced chemical vapor deposition ("PECVD") reactor. That reactor is then operated under conditions that cause a CDO layer to be deposited on the substrate. Example precursors used in such a PECVD process include alkyl silane and alkyl oxysilane precursors such as methyl silane, trimethyl silane, and dimethyl dimethoxysilane.

When, in such a process, the substrate temperature is maintained above 380° C., the resulting CDO layer may have a dielectric constant of about 3.0. In some circumstances, it may be desirable to further reduce the dielectric constant for that layer. When an alkyl silane precursor (e.g., methyl silane or trimethyl silane) is used, maintaining the substrate temperature below 200° C. during the deposition process may yield a CDO layer with a lower dielectric constant. Such materials, however, may exhibit unsatisfactory mechanical properties, such as edge flaking, due to poor adhesion and low cohesive strength. Materials deposited using an alkyl oxysilane precursor may have superior mechanical properties at equivalent dielectric constant.

Accordingly, there is a need for an improved process for making a carbon doped oxide. There is a need for such a process that generates a CDO material with a reduced dielectric constant and acceptable mechanical properties, which can be easily integrated into existing processes for making semiconductors. The method of the present invention provides such a process.

DETAILED DESCRIPTION OF THE PRESENT INVENTION

Figure 1:
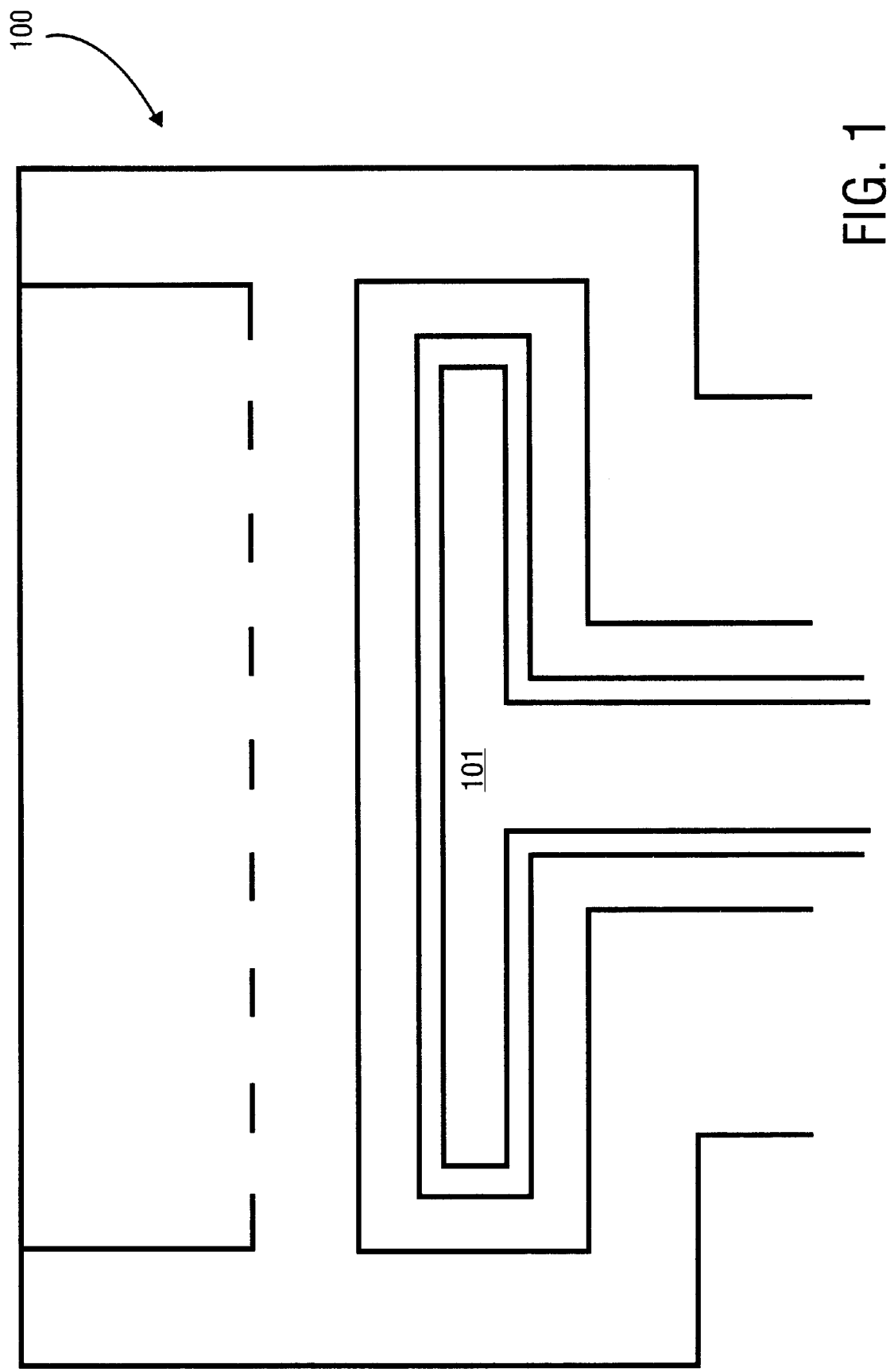
FIG. 1 provides a schematic representation of a CVD chamber for a PECVD reactor, which includes a chilled chuck.

A method is described for forming a carbon doped oxide dielectric material on a substrate. That method comprises introducing into a chemical vapor deposition apparatus an alkyl oxysilane precursor. While maintaining the substrate temperature at less than about 200° C., that apparatus is operated under conditions that cause a carbon doped oxide to form on the substrate. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

In the method of the present invention, a substrate, e.g., a silicon wafer upon which various conducting and insulating layers may have been formed, is placed in a chemical vapor deposition apparatus—preferably a PECVD reactor. In a particularly preferred embodiment, as shown in FIG. 1, reactor 100 includes chilled chuck 101 for reducing the temperature of the wafer that chuck 101 holds. Such a PECVD reactor, which enables low temperature deposition, may be obtained from Applied Materials, Inc. or Trikon Technologies, Inc. To form a CDO layer on such a substrate, in accordance with the method of the present invention, an alkyl oxysilane precursor is introduced into the reactor in the conventional manner. Such a precursor has the general formula $SiO_xC_yH_z$ in which there is at least one silicon-to-carbon bond and at least one silicon-to-oxygen bond. Some examples of such materials include methyltrimethoxysilane, dimethyldimethoxysilane, trimethylmethoxysilane, methyl phenyl dimethoxysilane, diphenyl dimethoxysilane, and octamethyl cyclotetrasiloxane, but many others exist as well, as will be apparent to those skilled in the art.

Except for the reduced wafer temperature, PECVD reactor 100 may be operated under conditions that are conventionally used to deposit a CDO material from an alkyl oxysilane precursor such that the deposited material maintains the molecular character of the precursor. In some cases, it may be desirable to feed helium, argon, or nitrogen, and perhaps another oxygen source such as oxygen or nitrous oxide, into the reactor—in addition to the alkyl oxysilane precursor, as is well understood by those skilled in the art. Optimal operating conditions (e.g., pressure and power) may, of course, vary depending upon the specific precursor used, the type of PECVD reactor used, and the desired properties for the resulting CDO material. In many cases, the molecular structure of the precursor may be maintained by operating the PECVD reactor at low power relative to the power that would be applied, for example, to deposit silicon dioxide from tetraethyl oxysilane (TEOS). By using a PECVD reactor that includes a chilled chuck, the substrate temperature may be kept at or below about 200° C.—preferably, between about −20° C. and about 200° C. The optimal temperature may depend upon the precursor and reactor used, other operating parameters, and the desired CDO characteristics.

After the CDO layer is deposited, it may be desirable to apply an annealing step to outgas volatile species, e.g., water, hydrogen and other low molecular weight substances. The temperature chosen for such an annealing step should ensure that the material can withstand the demands that subsequent process steps impose on it. In some applications, applying a temperature of about 400° C. for about 10 minutes should be adequate to meet that objective. When formed to make a semiconductor device, the resulting CDO layer preferably includes between about 5 and about 50 atom % carbon. In addition, that layer preferably has a dielectric constant that is less than or equal to about 2.8.

The method of the present invention may enable a substantially uniform and particle free CDO layer to be formed using a PECVD reactor, despite depositing such a material on a chilled substrate. For a given dielectric constant, the improved method of the present invention may produce a CDO layer that has superior mechanical properties (e.g., those relating to adhesion, cohesion, and fracture toughness), when compared to those of CDO layers formed using different precursors (i.e., other than alkyl oxysilane species).

Although the foregoing description has specified certain steps, materials, and equipment that may be used in such a method, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method of forming a carbon doped oxide dielectric material on a substrate comprising:
   introducing into a chemical vapor deposition apparatus an alkyl oxysilane precursor; then
   operating the apparatus under conditions that cause a carbon doped oxide to form on the substrate, while maintaining the substrate temperature at less than about 200° C.

2. The method of claim 1 wherein the chemical vapor deposition apparatus is a plasma enhanced chemical vapor deposition reactor.

3. The method of claim 2 wherein the resulting carbon doped oxide has a dielectric constant that is less than or equal to about 2.8.

4. The method of claim 3 wherein the alkyl oxysilane precursor has the formula $SiO_xC_yH_z$ in which there is at least one silicon-to-carbon bond and at least one silicon-to-oxygen bond.

5. The method of claim 4 wherein the alkyl oxysilane precursor is selected from the group consisting of methyltrimethoxysilane, dimethyldimethoxysilane, trimethylmethoxysilane, methyl phenyl dimethoxysilane, diphenyl dimethoxysilane, and octamethyl cyclotetrasiloxane.

6. The method of claim 5 further comprising introducing into the reactor at least one additional precursor selected from the group consisting of alkyl oxysilane and alkyl silane precursors.

7. The method of claim 5 further comprising introducing into the reactor an additional source of oxygen.

8. The method of claim 7 wherein the reactor includes a chilled chuck for maintaining the substrate temperature at less than about 200° C.

9. The method of claim 8 further comprising applying an annealing step after the carbon doped oxide is formed.

10. The method of claim 9 wherein the substrate includes a silicon wafer.

11. A method of forming a semiconductor device comprising:
    forming on a substrate a dielectric layer that includes a carbon doped oxide by:
      introducing into a plasma enhanced chemical vapor deposition reactor an alkyl oxysilane precursor; then
      operating the reactor to cause the carbon doped oxide dielectric layer to form on the substrate, while maintaining the substrate temperature at less than about 200° C.

12. The method of claim 11 further comprising applying an annealing step after the carbon doped oxide is formed.

13. A method of forming a semiconductor device comprising:
    forming on a substrate a dielectric layer that includes a carbon doped oxide by:
      introducing into a plasma enhanced chemical vapor deposition reactor an alkyl oxysilane precursor, the reactor including a chilled chuck;
      operating the reactor to cause the carbon doped oxide dielectric layer to form on the substrate, while using the chilled chuck to maintain the substrate temperature at less than about 200° C., then
      applying an annealing step after the carbon doped oxide is formed.

14. The method of claim 13 wherein the resulting carbon doped oxide has a dielectric constant that is less than or equal to about 2.8.

15. The method of claim 14 wherein the alkyl oxysilane precursor has the formula $SiO_xC_yH_z$ in which there is at least one silicon-to-carbon bond and at least one silicon-to-oxygen bond.

16. The method of claim 15 wherein the alkyl oxysilane precursor is selected from the group consisting of dimethyl dimethoxysilane, methyl phenyl dimethoxysilane, diphenyl dimethoxysilane, and octamethyl cyclotetrasiloxane.

17. The method of claim 15 wherein the temperature of the substrate is maintained between about −20° C. and about 200° C.

* * * * *